(12) United States Patent
Blair et al.

(10) Patent No.: US 11,803,681 B1
(45) Date of Patent: Oct. 31, 2023

(54) WAFER-SCALE LARGE PROGRAMMABLE DEVICE

(71) Applicant: XILINX, INC., San Jose, CA (US)

(72) Inventors: Zachary Blair, San Jose, CA (US); Alireza Kaviani, San Jose, CA (US)

(73) Assignee: XILINX, INC., San Jose, CA (US)

( * ) Notice: Subject to any disclaimer, the term of this patent is extended or adjusted under 35 U.S.C. 154(b) by 263 days.

(21) Appl. No.: 17/209,006

(22) Filed: Mar. 22, 2021

(51) Int. Cl.
*G06F 30/323* (2020.01)
*H01L 25/065* (2023.01)
*H01L 27/02* (2006.01)
*G06F 30/3947* (2020.01)

(52) U.S. Cl.
CPC ........ *G06F 30/323* (2020.01); *G06F 30/3947* (2020.01); *H01L 25/0655* (2013.01); *H01L 27/0207* (2013.01)

(58) Field of Classification Search
CPC ............................ G06F 30/323; G06F 30/3947
USPC ........................................................ 716/103
See application file for complete search history.

(56) References Cited

U.S. PATENT DOCUMENTS

| | | | | |
|---|---|---|---|---|
| 6,150,840 A * | 11/2000 | Patel | .......... | G03F 1/00 |
| | | | | 326/101 |
| 10,032,682 B1 | 7/2018 | Klein et al. | | |
| 11,003,827 B1 * | 5/2021 | Kundarewich | ....... | G06F 30/347 |
| 11,176,296 B1 * | 11/2021 | Jha | .......... | G06F 30/33 |
| 11,404,316 B2 * | 8/2022 | Yu | ............... | H01L 24/03 |
| 2015/0135147 A1 * | 5/2015 | Emirian | ................ | G06F 30/331 |
| | | | | 716/105 |
| 2020/0371787 A1 * | 11/2020 | Gupta | .......... | G06F 8/41 |
| 2020/0372123 A1 * | 11/2020 | Gupta | .......... | G06F 7/57 |
| 2021/0081536 A1 * | 3/2021 | Zhang | .......... | H04L 9/30 |
| 2021/0202312 A1 * | 7/2021 | Yu | ............ | H01L 23/481 |
| 2021/0375681 A1 * | 12/2021 | Han | ............ | H01L 21/8232 |

OTHER PUBLICATIONS

"Wafer-Scale Deep Learning" Cerebras Systems, Hot Chips:A Symposium on High Performance Chips, Conference Sponsor IEEE Technical Committee on Microprocessors and Microcomputers, Aug. 18-20, 2019, retrieved from https://old.hotchips.org/archives/2010s/hc31/.

* cited by examiner

*Primary Examiner* — Suchin Parihar
(74) *Attorney, Agent, or Firm* — Patterson + Sheridan, LLP

(57) ABSTRACT

The embodiments herein rely on cross reticle wires (also referred to as cross die wires) to provide communication channels between programmable dies already formed on a wafer. Using cross reticle wires to facilitate x-die communication can be three to four orders of magnitude faster than using general purpose I/O. With a wafer containing cross reticle wires, various device geometries can be generated at dicing time by cutting across different reticle boundaries. This allows up to full wafer-size devices, or several smaller sub-wafer devices to be derived from one wafer. Although the programmable dies can contain defects, these defects can be identified and avoided when generating a bitstream for configuring programmable features in the programmable dies.

20 Claims, 5 Drawing Sheets

US 11,803,681 B1

WAFER-SCALE LARGE PROGRAMMABLE DEVICE

TECHNICAL FIELD

Examples of the present disclosure generally relate to handling defects in programmable dies that are communicatively coupled by cross reticle wires.

BACKGROUND

One current method to build large devices (that contain multiple dies) is to place multiple known-good-dies (KGDs) side-by-side on an interposer. This method is called stacked silicon interconnect technology (SSIT) where communication between the KGDs is provided by wires or traces in the interposer. As such, the communication bandwidth between the dies is limited by the number of wires in, or on, the interposer. These wires are also slower and less dense relative to on-die wires due to being routed off-chip through micro bumps, which creates a communication bottleneck.

Larger designs, such as emulation applications, often do not fit on a single multi-die device, and thus, require a second level of partitioning where the dies have to communicate with external computing devices via a printed circuit board (PCB). The available channels are typically SERDES, which are limited to tens of channels with a high latency penalty and multi-gigabit speed, or hundreds of digital input/outputs (I/Os), which have lower latency but less throughput (on the order of 100 Mbit). Applications such as whole-chip emulation make use of both types of I/O, and inherit their bottlenecks. Other techniques for building large multi-die devices such as using embedded multi-die interconnect bridge (EMIB) (instead of an interposer) or organic substrate for multi-chip modules (MCM) generally have the same disadvantages as SSIT where dies are interconnected using slower communication channels and the design is partitioned into multiple devices.

SUMMARY

One embodiment describes a computing system that includes a non-transitory computer readable storage medium having program instructions embodied therewith, the program instructions executable by a processor to perform an operation. The operation includes receiving a netlist defining a schematic to be implemented on a multi-die device, the multi-die device comprising multiple dies each comprising a programmable feature where the multiple dies are interconnected by cross reticle wires, receiving defect constraints identifying defective resources in one or more of the programmable features of the multiple dies, generating a design for the multi-die device that avoids the defective resources using the netlist and the defect constraints, and generating, based on the design, a bitstream for configuring the programmable features in the multiple dies of the multi-die device.

Another embodiment described herein is a method that includes receiving a netlist defining a schematic to be implemented on a multi-die device, the multi-die device comprising multiple dies each comprising a programmable feature where the multiple dies are interconnected by cross reticle wires, receiving defect constraints identifying defective resources in one or more of the programmable features of the multiple dies, generating a design for the multi-die device that avoids the defective resources using the netlist and the defect constraints, and generating, based on the design, a bitstream for configuring the programmable features in the multiple dies of the multi-die device.

Another embodiment described herein is a multi-die device that includes multiple dies each comprising a field programmable gate array (FPGA), wherein the multiple dies are part of a same wafer and cross reticle wires connecting a first FPGA in first one of the multiple dies to a second FPGA in a second one of the multiple dies, wherein the first and second dies directly neighbor each other in the multi-die device.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
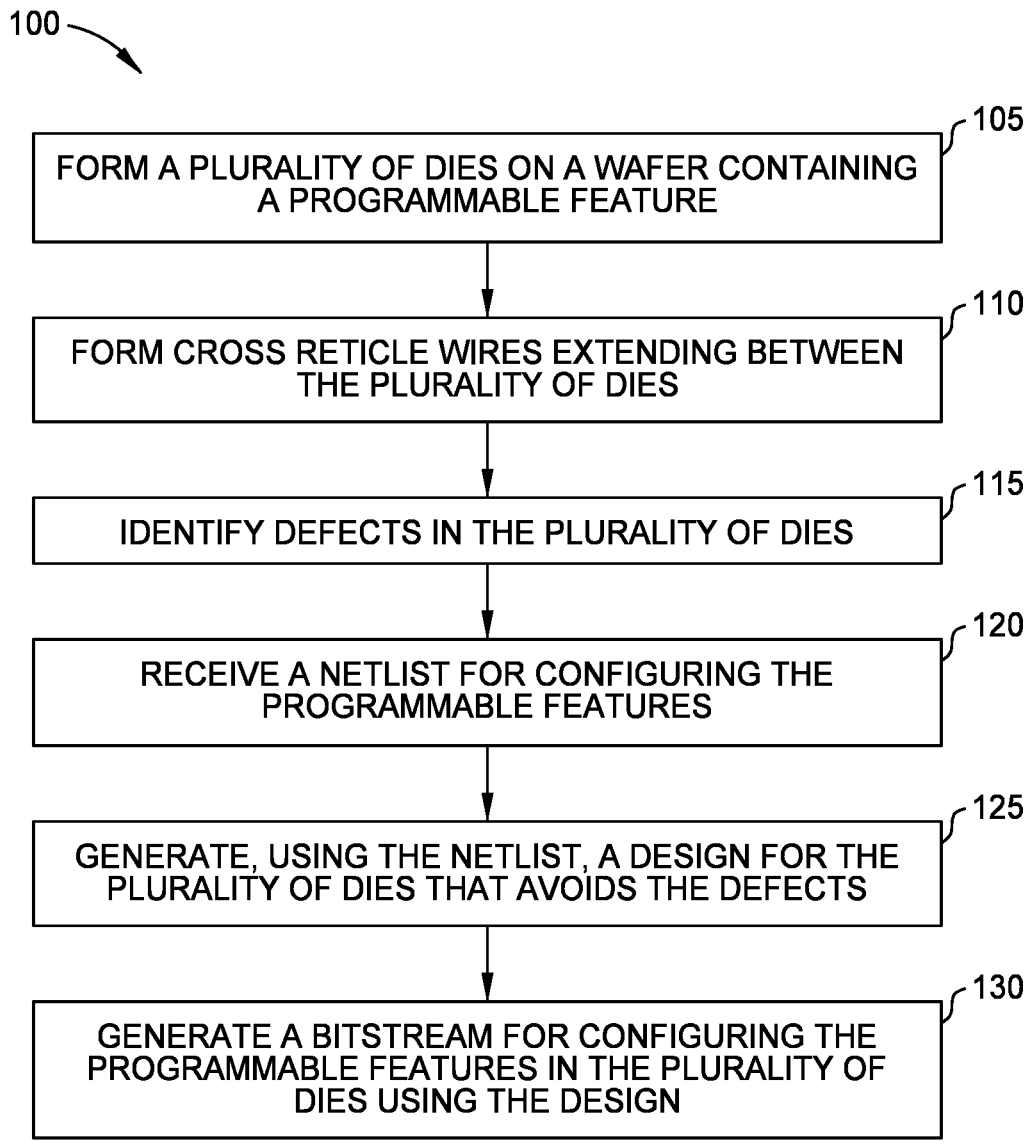
FIG. 1 is a flowchart for wafer-scale fabrication of programmable devices with cross reticle wires, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe a wafer-scale architecture with increased wire density and higher per-wire throughput compared to SSIT, EMIB, and MCM solutions by stitching adjacent programmable dies across reticle boundaries in upper metal layers when fabricating the wafer. This is done at the wafer level and includes techniques for mitigating the drawbacks of reduced yield due to defects in the programmable dies. The embodiments herein ease the burden of designing and partitioning across fabric discontinuities with high-latency channels in mind.

The embodiments herein rely on cross reticle wires (also referred to as cross die wires) to provide communication channels between the programmable dies already formed on the wafer. Using cross reticle wires to facilitate x-die communication can be one to four orders of magnitude faster than using general purpose I/O supported by SSIT, EMIB, MCM, or PCB. With a wafer containing cross reticle wires, various device geometries can be generated at dicing time by cutting across different reticle boundaries. This allows up to full wafer-size devices, or several smaller sub-wafer devices to be derived from one wafer.

The embodiments herein can be used with any programmable dies such as field programmable gate arrays (FPGAs), systems on chip (SoC), or any other integrated circuit that contains a programmable feature. These programmable features can include programmable logic (e.g., a programmable fabric), programmable network-on-a-chip (NoC) and the like which are configured at, or before runtime, using a bitstream. For example, with FPGAs, the cross reticle wires can extend the routing fabric of each FPGA to the neighboring FPGAs formed on the wafer. In the case of a SoC containing a programmable NoC, conditionally enabled channels in the NoCs can cross the reticle boundaries using the cross reticle wires.

FIG. 1 is a flowchart of a method 100 for wafer-scale fabrication of programmable devices with cross reticle wires, according to an example. At block 105, a plurality of dies containing programmable features is formed on a wafer. The term "programmable die" is used herein to describe a die with a programmable feature such as programmable logic or a programmable NoC. The programmable dies are formed using any number of fabrication steps. For example, a wafer can contain tens, hundreds, or thousands of programmable dies which are exact copies of each other (although a wafer could have dies that are different from each other).

A reticle is a tool that contains a pattern image that needs to be stepped and repeated in order to expose the entire wafer or mask. In one embodiment, the dies in the wafer are formed by moving a reticle (or a series of reticles) to apply a pattern to each of the dies. Thus, the area of a die may be defined by the area of the reticle. While a reticle may be used to form multiple dies, it becomes more difficult to achieve correct alignment. Moreover, a reticle typically does not provide communication links between dies because of the problems associated with aligning communication links that extend between dies. Rather, dies are typically designed in a wafer to be diced apart, and then if desired, communicatively coupled to form larger multi-die devices using SSIT, EMIB, MCM, etc.

At block 110, upper layers in the dies are used to from cross reticle wires extending between the plurality of dies on the wafer. That is, after forming the individual dies at block 105, cross reticle wires are added to communicatively couple at least one die with another die in the wafer. In one embodiment, the dies have cross reticle wires to each of their directly neighboring dies (e.g., east, west, north, and south assuming the die is not at an edge of the wafer). But in other embodiments the dies may also connect the neighboring dies at an angle (e.g., southeast or northwest). Further, some of the dies may not be connected to all the other dies. For example, if a customer wants to form multi-die devices using half of the dies in a wafer, then there may not be cross reticle wires between dies that are for two different multi-die devices. Because the cross reticle wires are formed in the uppermost layers of the wafer, it is a lower-cost decision to change the arrangement of the cross reticle wires by changing the aperture device relative to changing the lower layers.

However, in another example, the dies may have cross reticle wires regardless if they are to be used in the same multi-die device or not. During a dicing step, the cross reticle wires extending between dies that are for different devices can be diced through.

Figure 2:
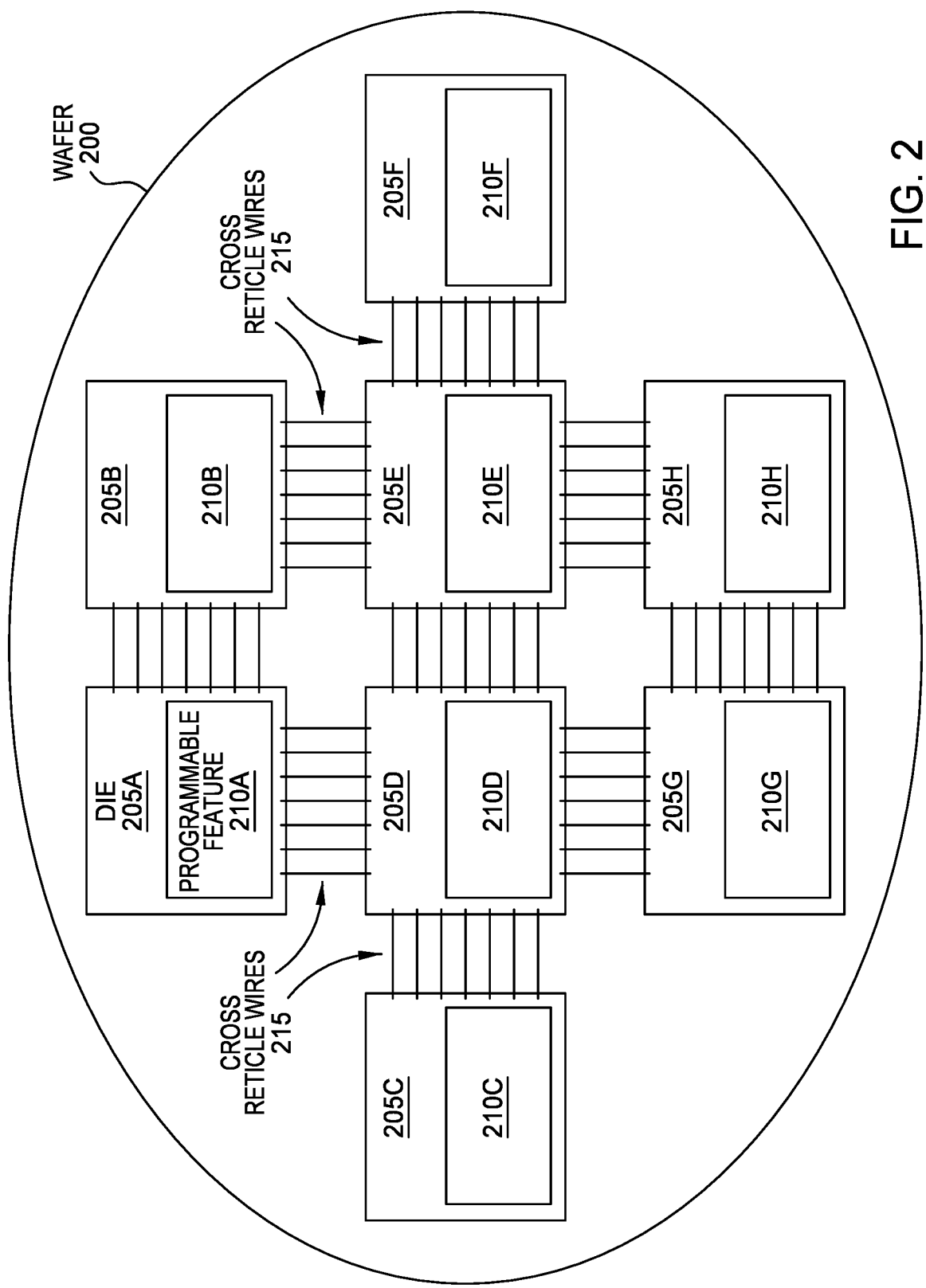
FIG. 2 illustrates a wafer with a plurality of dies with cross reticle wires, according to an example.

FIG. 2 illustrates a wafer 200 with a plurality of dies 205 with cross reticle wires 215, according to an example. In this example, the wafer 200 includes dies 205 which are programmable dies that each include a programmable feature 210 (e.g., programmable logic, programmable NoCs, etc.). In one embodiment, the dies 205 have the same design (e.g., have the same circuitry), although this is not a requirement.

The cross reticle wires 215 extend between the dies 205 so that neighboring dies can communicate. For example, the die 205D can use its cross reticle wires to communicate with dies 205A, 205C, 205E, and 205G. However, dies at the edge of the wafer 200 are able to directly communicate with a different number of dies than dies in the center portions of the wafer 200. In any case, even if a die 205 does not have a direct cross reticle wire 215 connecting it to a die in the wafer 200, the dies 205 can be designed so that they can forward communications received from one die to a neighboring die. For example, during operation, the die 205C may want to communicate data to the die 205E. The die 205D (which has cross reticle wires 215 connecting it to both these dies) can facilitate communication between the die 205C and 205E.

Moreover, while the wafer 200 illustrates a scenario where the dies 205 have cross reticle wires to their direct neighbors (south, east, west, and north, if applicable), in other embodiments, they may not. For example, the dies 205A and 205B may be used to form a first multi-die device, the dies 205C, 205D, and 205G may be used to form a second multi-die device, and the dies 205E, 205F, and 205H may be used to form a third multi-die device. Cross reticle wires 215 are not needed for dies 205 in different devices. However, it may be preferred (e.g., reduce cost or provide more flexibility) to form the cross reticle wires 215 between all the neighbors, and then let the customer instruct the manufacturer how to dice the wafer 200 to form multiple devices by dicing through some of the cross reticle wires 215 (assuming they do not want one large wafer-scale device).

In one embodiment, the dies 205 are individual FPGAs (e.g., copies of the same FPGA) connected by the cross reticle wires 215. Each of the FPGAs can include FPGA interconnect (INT) tiles have a plurality of switches driving wires with various length. These wires can be different lengths: single, double, long that traverse one or two or 8-12 INT tiles, respectively. Super Long Lines (SLLs) are long lines (or wires) that traverse multiple tiles (e.g., tens of tiles). Each INT tile has a plurality of switches driving SLLs. In one embodiment, the SLLs can stop at the edge of die 205 (e.g., the edge of a particular FPGA), or are used for connectivity on an interposer through micro-bumps. However, in a wafer-scale device as shown in FIG. 2, the SLLs could be used as the cross-reticle wires 215. Moreover, the SLLs could cross the defected areas, which may be aligned with the redundancy schemes described in the other embodiments herein.

In one embodiment, to extend a programmable fabric between the FPGAs in the wafer 200 is to augment the INT tiles near the edge/borders of the FPGAs with larger buffers, enabling them to drive the SLLs between dies/FPGAs. Further, the SLLs that extend between FPGAs can include bidirectional wires with tristate buffers. These special INT tiles for the SLLs may connect to the upper metal layers so the SLLs used as the cross reticle wires 215 can be disposed in these layers.

In another embodiment, SLL buffers can be spread throughout the FPGAs instead of just in the INT tiles at the edge. These buffers can be routed to microbumps and used for inter-die (inter-FPGA) using the cross reticle wires or intra-die (intra-FPGA) connectivity for very long paths on an interposer. In one embodiment, the SLL buffers may be more dense near the device's edge to supply full bandwidth across the reticle boundary.

Returning to the method 100 in FIG. 1, at block 115, a testing apparatus identifies defects in the plurality of dies. Often, with wafer scale fabrication, the dies contain defects that may negatively impact the function of the entire die, or a subportion of the die. That is, a defect may not cause the entire die to fail. For example, a portion of the programmable fabric in one of the dies may be nonfunctional while the remaining portion of the fabric is functional. One advantage of programmable logic is its natural redundancy resulting from the flexibility of being configurable by a bitstream. As such, defective portions in programmable logic can often be avoided.

To identify defects in the dies, the wafer can be coupled to the testing apparatus which communicates with each of the dies and tests their various circuits. The testing apparatus can use known or future defect detection techniques such as SRAM cell testing with offline bitstream program and readback. These techniques can be expanded on with the automatic generation of a series of bitstreams to exhaustively test resources other than SRAMs (e.g., logic elements and wires in the dies) with online stimulus.

In one embodiment, the result of defect detection is a list of faulty resources in a die, or in multiple dies, that cannot be used in a design. In previous multi-die implementations, a die that has any defects is typically discarded, leaving only KGDs to be used to form a multi-die device. However, instead of discarding the dies, all the dies can be delivered to the customer, along with the list of defective resources in those dies. With a list of defective resources, defect avoidance can be executed using the remaining blocks of method 100.

At block 120, a netlist is received (or generated) for configuring the programmable features on the dies. The method 100 assumes that the netlist is for configuring all the dies in the wafer, but if a customer wants to form a multi-die device from a subportion of the dies in the wafer, than the wafer may be diced, by the manufacture, to separate the dies for the device from the remaining dies in the wafer.

In one embodiment, the netlist defines a schematic to be implemented in the programmable features in the dies forming the multi-die device. The netlist comprises functional blocks of circuitry (e.g., physical electronic components) and defines how that circuitry should be communicatively coupled. The netlist may be generated by synthesizing a hardware description language (HDL) such as Verilog or VHDL using a synthesizing application (e.g., a software application).

At block 125, placement and routing applications (e.g., software applications or a software suite) generates, using the netlist, a design for the programmable features in the plurality of dies that avoids the defects. In one embodiment, the list of defective components is passed as constraints to the placement and routing applications which prohibit placement and routing that would utilize defective circuitry in the programmable features. There are various ways of using the list of defective components as constraints in the routing and placement process, and two such ways are described in more detail in FIGS. 3 and 4 below.

At block 130, an application generates a bitstream for configuring the programmable features in the dies using the design determined at block 125. The bitstream ensures the design does not rely on the defective resources identified at block 115. In this manner, the design includes multiple dies that are connected by the low latency cross reticle wires rather than the other types of I/O techniques supported by SSIT, EMIB, MCM, and the like. Further, recognizing the reality that the dies may have some defective resources, the method 100 provides a way for the defective resources in the programmable features to be avoided during the routing and placement steps. Thus, the bitstream can configure the multi-die device to rely solely on the functional resources in the programmable features of the dies.

Further, the multi-die device can be disposed on an interposer or packaged with other devices that use the previous communication techniques describe above. For example, some of the communication between the dies in the multi-die device can use wires in an interposer (as part of a SSIT implementation) rather than using the cross reticle wires. Further, a design may be too large for a wafer scale implementation in which case the interposer can be used to connect multiple wafer-scale devices (each formed using the method 100) to each other, or to connect the dies to an external computing system. Thus, the multi-die devices described in method 100 can also be used with SSIT, EMIB, and MCM to form even larger device packages.

Figure 3:
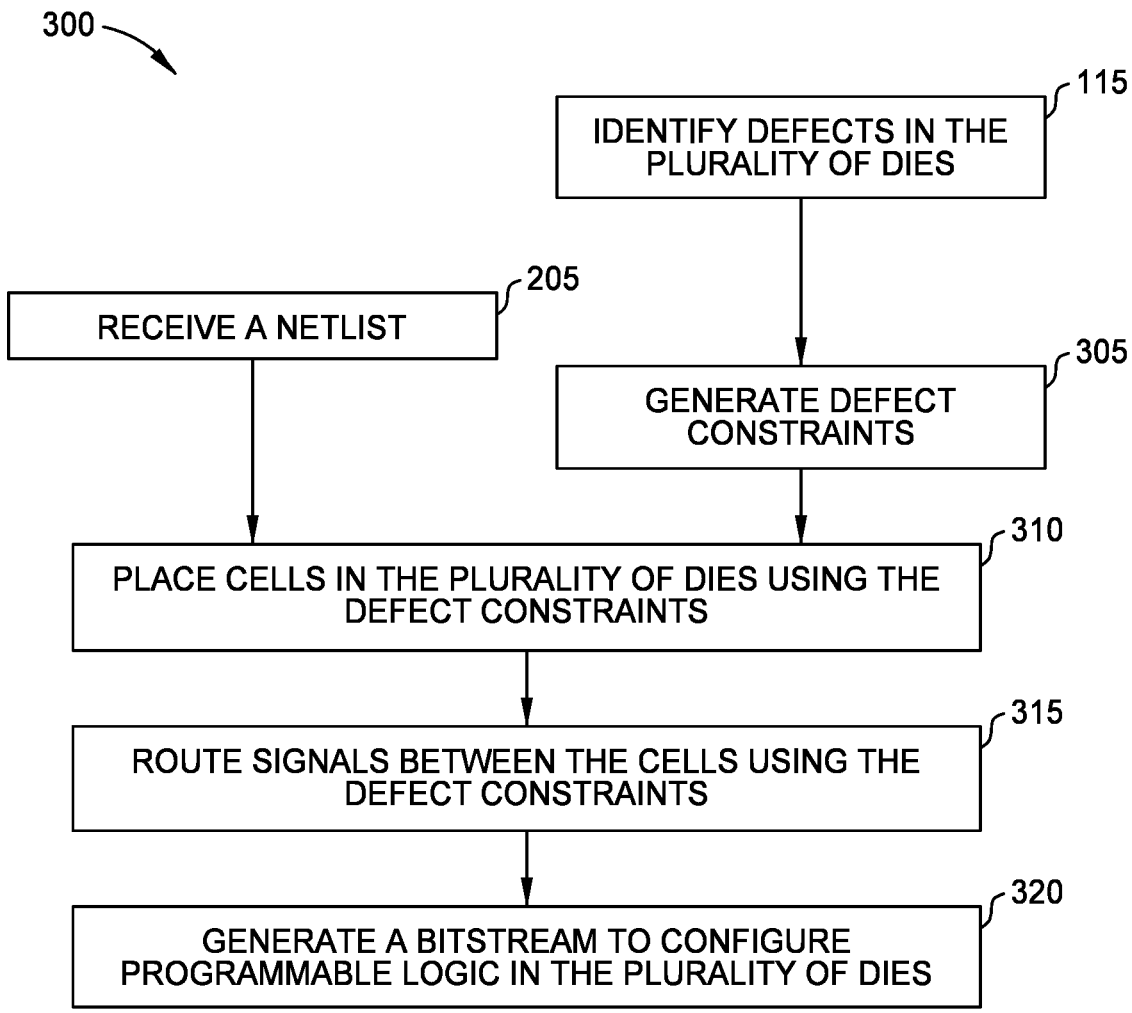
FIG. 3 is a flowchart for performing placement and routing on programmable dies with cross reticle wires, according to an example.

FIG. 3 is a flowchart of a method 300 for performing placement and routing on programmable dies with cross reticle wires, according to an example. Specifically, the method 300 performs placing and routing to avoid defects in the programmable logic in the die. Moreover, while the method 300 specifically mentions programmable logic, it can be expanded to be performed on other types of programmable features, such as a programmable NoC.

The method 300 begins at block 120 when a netlist is received, as discussed in method 100. The method 300 also includes block 115 where the defects in the plurality of dies are identified, as discussed in the method 100. These two blocks are independent of each other, and thus, can be performed at the same time or different times.

At block 305, an application generates defect constraints from the list of defects identified at block 115. The defect constraints are additional placement and routing constraints that can be considered along with other constraints such as timing, congestion, heat generation, and the like.

Depending on the output of the testing apparatus used to identify the defects, the defects (e.g., a list of defective or broken programmable interconnect points (PIPs) in the programmable logic) are converted to a list of placement and routing resources that should be avoided. The application can use an algorithm that identifies primary defects as well as secondary defects, which include all resources that are unusable as a result of a primary defects, even if those resources are themselves not defective (i.e., do not contain defective circuitry).

An example constraint to avoid a logic site in programmable logic is "set_property PROHIBIT true [get_sites SLICE_X3Y122]" which is nomenclature that is part of Xilinx's Vivado® TCL interface. The granularity at which the defective resources are blocked can vary. For example, the constraints may instruct the routing application to avoid a basic element that has defective circuit (e.g., a particular flip flop or look-up table), of the constraint may instruct the routing application to avoid an entire block of programmable logic (e.g., a tile) when one of the basic elements in that block is defective. In addition to blocking defective computational elements during placement, other constraints can disable routing resources in the programmable logic. Similar to placement, defective routing resources can be disabled using various levels of granularity such as disabling some of the routing in a block of programmable logic or disabling all the routing in a block of programmable logic.

At block 310, a placement application places cells in the plurality of dies using the netlist and the defect constraints. That is, the placement application ensures that the blocks of circuitry defined in the netlist (which from the cells) are not assigned to defective resources in the programmable logic of the dies (e.g., a defective basic element, or a block of programmable fabric containing a defective resource). For example, the placement application can use the defect constraints to eliminate portions of the programmable logic that are defective from a candidate pool of available resources to host the cells.

At block 315, a routing application routes the signals between the cells using the defect constraints. Here, the routing application may ensure none of the signals are connected to the defective resources identified by defect constraints. Further, if the defect constraints contain routing resources, the routing application ensures these defective resources are not used to route the signals between the cells.

At block 320, an application generates a bitstream to configure programmable logic in the plurality of dies. This bitstream can use the cell placement and signal routing described in blocks 310 and 315 which avoids the defective resource in the programmable logic of the dies. In this manner, a multi-die device can be formed from multiple dies that communicate using cross reticle wires, even if these dies include defective portions.

Method 300 differs from prior solutions to placement and routing in that those solutions assumed all resource were available (i.e., functional). It was also assumed a bitstream for each multi-die device would be identical because all the dies in the devices are KGDs. However, in method 300, each multi-die device may have different defects (e.g., a first subset of dies in a first device has defects while a different subset of dies in a second device has defects). Thus, the bitstreams for these multi-die devices may be different in order to avoid the various defects that arise when fabricating the wafers producing the devices. In method 300, a bitstream generated for a particular multi-die device can be copied to other multi-die devices after checking that the design also does not utilize defective resources in those devices.

Figure 4:
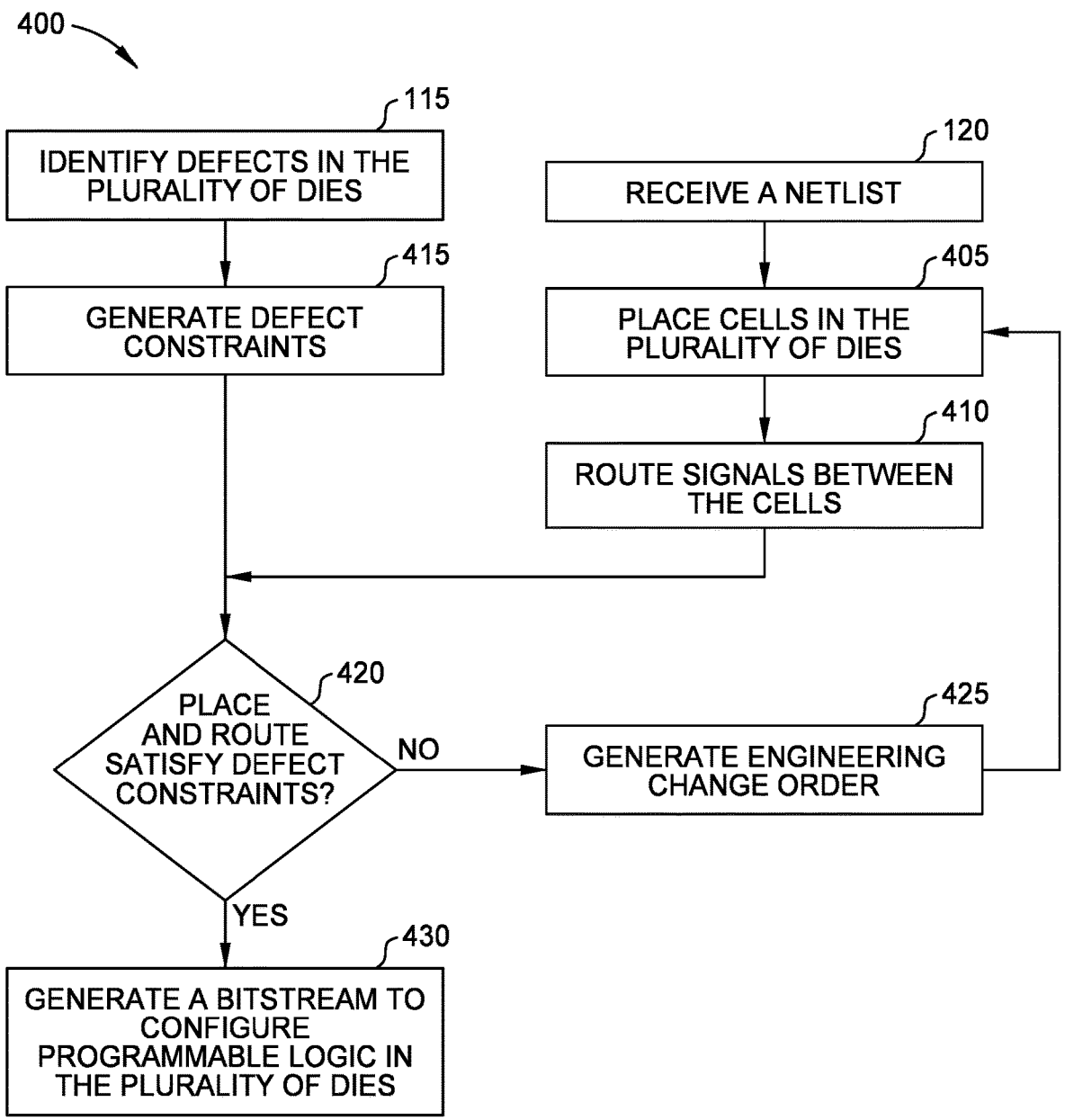
FIG. 4 is a flowchart for performing placement and routing on programmable dies with cross reticle wires, according to an example.

FIG. 4 is a flowchart of a method 400 for performing placement and routing on programmable dies with cross reticle wires, according to an example. Specifically, the method 400 performs placement and routing to avoid defects in the programmable logic in the die. Moreover, while the method 400 specifically mentions programmable logic, it can be expanded to be performed on other types of programmable features, such as a programmable NoC.

The method 400 is an alternative to method 300 where instead of using defect constraints to affect the routing and placement process, the defect constraints are used to generate engineering change orders (ECOs). In an application specific integrated circuit (ASIC) ECO flow, minor modifications to implement designs are made to fix bugs. This involves comparing the original netlist to a revised netlist and re-running the place and route algorithm for effected portions of the design. For the defect avoidance ECO flow described in method 400, instead of changing the design (i.e., the netlist) as done in the method 300, the netlist remains the same while some device resources are removed. Any cells or nets that were placed or routed onto defective resources are torn up and re-implemented.

The method 400 begins at block 120 where a netlist is received. At block 405, the placement application places cells in the plurality of dies using the netlist. At block 410, the routing application routes signals between the cells. Unlike in the method 300, here, the placement and routing application do not consider defect constraints, at least when processing the received netlist. As a result, the resulting design may place cells in defective resources, or use defective routing resources.

The method 400 also includes block 115 where a testing apparatus identifies defects in the plurality of dies, and at block 415, generates defect constraints. The defect constraints can include any of the constraints discussed at block 305 of the method 300.

At block 420, an ECO application (e.g., a software application) receives, as inputs, the defect constraints and determines whether the design generated by the placement and routing applications satisfy the defect constraints. That is, the ECO application determines whether the design relies on a defective resource in one of the dies.

If so, the method 400 proceeds to block 425 where the ECO application generates an ECO that removes any cells or nets that were placed or routed onto defective resources. In response, the placement application, the routing application, or both has to re-run their algorithms in response to the ECO in order to avoid the defective resources.

Once the defective resources are removed from the design using the ECO (or multiple ECOs), at block 430 an application generates a bitstream to configure the programmable logic in the plurality of dies which avoids the defective resources.

In one embodiment, the method 400 can use the design generated by placement and routing applications in a design checkpoint and make ECO changes for several multi-die devices, where each ECO results in creating a bitstream valid for one device. Put differently, after the placement and routing applications determine a design for the netlist (which assumes all the resources in the dies are available), the ECO generator can compare that design to respective defect constraints for a plurality of multi-die devices. If the design avoids the defective resources in one or more of the plurality of multi-die devices, then that design can be used to generate a bitstream that will works for those devices, without using an ECO. However, for the multi-die devices where the design relies on defective resources, the ECO application can generate an ECO for each of the multi-die devices which results in a respective (or customized) bitstream for each of those devices.

In another embodiment, the list of defects can be the union of all defects on several multi-die devices. In that case, the ECO application can generate an ECO for that list of defects. Assuming the ECO can be resolved by the placement and routing applications, the resulting bitstream would then be valid for all the multi-die devices. Thus, one ECO could be used to generate a bitstream for multiple-die devices that have different defects. Further, identifying a list of defects from the union of all defects on several multi-die devices can also be used in the method 300 in FIG. 3.

Figure 5:
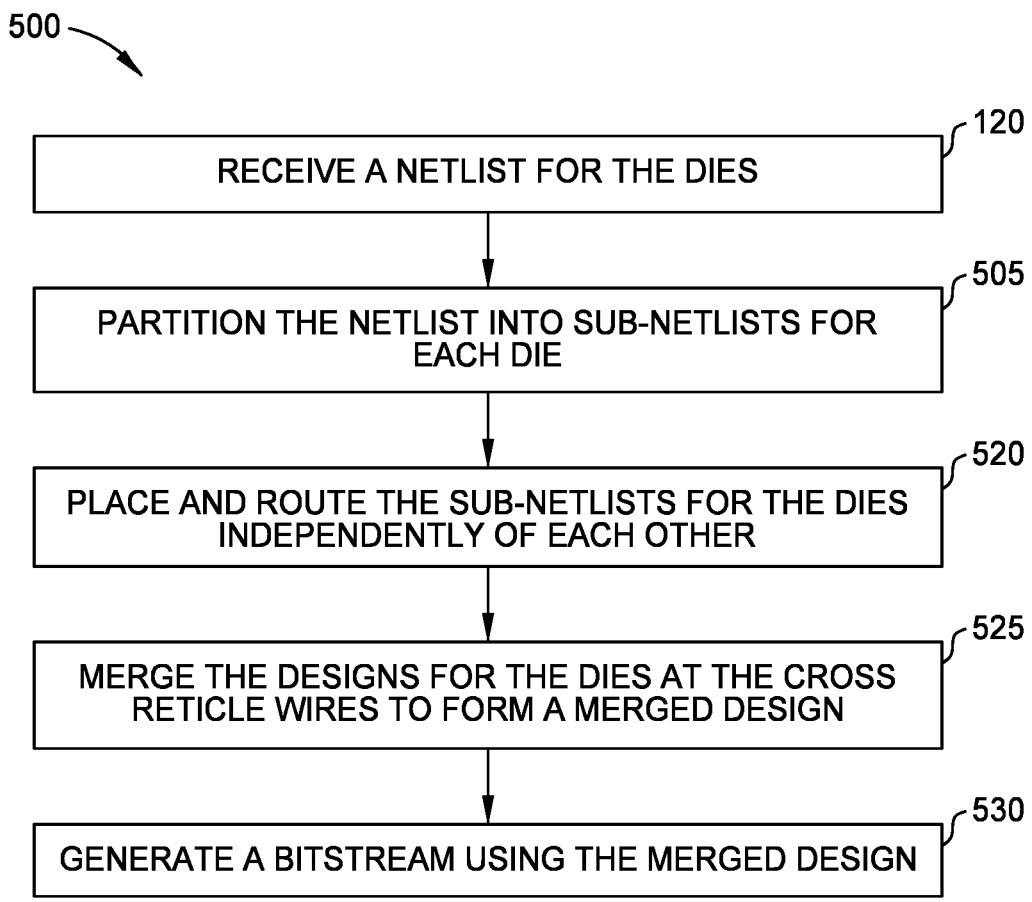
FIG. 5 is a flowchart for partitioning a netlist for a plurality of programmable dies with cross reticle wires, according to an example.

FIG. 5 is a flowchart of a method 500 for partitioning a netlist for a plurality of programmable dies with cross reticle wires, according to an example. Currently, SSIT devices, which contain multi-dies, rely on partitioning, place, and route algorithms that operate in the context of the entire multi-die device. In the early stages of the placement step, the design is partitioned into groups of cells (that will fit into each die. These groups of cells can be mapped (placed) on groups of resources (also referred to as super logic regions (SLRs)). This process can be guided by constraints (user assignments to dies or PBlocks) or entirely algorithmically.

Due to the performance impact of SSIT wires between dies and the limited availability (~10K wires, which is dependent on die size), a min-cut algorithm is used to partition the netlist. After grouping into SLRs, cells are placed onto resources in a single monolithic process with the entire device model and netlist in context. This allows some renegotiation across the SLR boundaries to improve performance, and allows timing paths across these boundaries to observed. Once cells are placed, the routing algorithms assign logical nets to physical net resources. Prior to placing the cells, the nets crossing between SLRs are known (cell source and sink in different SLR), but their exact crossing wire is not. However, while this approach works for smaller multi-die devices, the embodiments herein enable wafer-scale devices that can have significantly more dies than current multi-die devices. The duration of placement and routing on larger devices using current techniques can require days or even weeks to complete. Instead, the method 500 describes techniques for scalable place and routing.

At block 120, the netlist is received as discussed in any of the previous flowcharts. This netlist includes a schematic that, after method 500 is complete, spans across multiple dies in the multi-die device.

At block 505, a partitioning application partitions the netlist into sub-netlists for each die. Doing so makes it feasible to place and route each die separately using different processes or machines. However, the nets that cross between dies have a shared contract to ensure they connect to the same wire and meet timing. There are at least two way to negotiate the contract for connectivity between dies. First, during partitioning, for each logical net, the partitioning application selects a physical net between adjacent dies and fixes this as the connection point. Some amount of timing in the form of a MAX_DELAY constraint can be applied to each half of the logical net to ensure the routing algorithm meets timing without the other half of the net in context. Second, alternatively, the partitioning application can leave cross reticle wires un-implemented during sub-netlist place and route, then after merging the die implementations into a wafer-scale implementation, route the incomplete nets.

At block 510, the placement and routing applications place and route the sub-netlists for the dies independently of each other. In one embodiment, because the sub-netlists are independent, each sub-netlist can be assigned to a different computing resource (e.g., a different processing thread or a different virtual machine) so that the design for each die can be determined in parallel rather than attempting to place and route the entire netlist as a whole as done in previous solutions. As such, the large place and route task is partitioned into multiple smaller place and route tasks that can be executed in parallel.

Once the sub-netlists have been placed and routed to form respective designs for the dies, at block 515, the partitioning application merges the designs for the dies at the cross reticle wires to form a merged design. That is, using one of the two negotiation techniques discussed above, the sub-designs can be merged into one monolithic multi-die design for timing checks and design rule checking (DRC).

At block 520, an application generates a bitstream for the multi-die device using the merged design. By partitioning the netlist into sub-netlists that can be solved in parallel by multiple compute resources, the method 500 can execute much faster than previous SSIT techniques where the netlist is considered as a whole.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the users computer and partly on a remote computer or entirely on the remote computer or server. In the latter scenario, the remote computer may be connected to the users computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A non-transitory computer readable storage medium having program instructions embodied therewith, the program instructions executable by a processor to perform an operation, the operation comprising:
   receiving a netlist defining a schematic to be implemented on a multi-die device, the multi-die device comprising multiple dies each comprising a programmable feature, wherein the multiple dies were formed on a same wafer and interconnected by cross reticle wires formed in uppermost layers of the same wafer;
   receiving defect constraints identifying defective resources in one or more of the programmable features of the multiple dies;
   generating a design for the multi-die device that avoids the defective resources using the netlist and the defect constraints; and
   generating, based on the design, a bitstream for configuring the programmable features in the multiple dies of the multi-die device.

2. The non-transitory computer readable storage medium of claim 1, wherein the cross reticle wires connect a first die in the multi-die device to each of its directly neighboring dies in the same wafer.

3. The non-transitory computer readable storage medium of claim 1, wherein the programmable features are at least one of programmable logic or a programmable network-on-a-chip (NoC).

4. The non-transitory computer readable storage medium of claim 1, wherein generating the design for the multi-die device comprises:
   placing cells in the multiple dies based on the netlist and the defect constraints, wherein the defect constraints identify resources in the programmable feature where the cells cannot be placed.

5. The non-transitory computer readable storage medium of claim 4, wherein generating the design for the multi-die device comprises:
   routing signals between the cells based on the netlist and the defect constraints, wherein the defect constraints identify routing resources in the programmable feature which cannot be used to route the signals.

6. The non-transitory computer readable storage medium of claim 1, wherein generating the design for the multi-die device comprises:
   upon determining the design does not satisfy the defect constraints, generating an engineering change order to re-implement a portion of the design that relies on the defective resources.

7. The non-transitory computer readable storage medium of claim 6, wherein generating the design for the multi-die device comprises:
   forming a union of defect constraints for a plurality of multi-die devices, each of the plurality of multi-die devices having different defective resources; and
   upon determining the design does not satisfy the union of defect constraints, generating an engineering change order to re-implement the portions of the design that rely on the different defective resources,
   wherein the bitstream is generated after the engineering change order has been resolved, and wherein the bitstream is suitable to separately configure each of the plurality of multi-die devices despite these devices having different defective resources.

8. The non-transitory computer readable storage medium of claim 1, the operation further comprising:

partitioning the netlist into a plurality of sub-netlists each defining schematics for a respective one of the multiple dies in the multi-die device, wherein generating the design for the multi-die device comprises:

generating, in parallel, a respective design for each of the sub-netlists using different computing resources; and merging the respective designs to form the design.

9. A method comprising:

receiving a netlist defining a schematic to be implemented on a multi-die device, the multi-die device comprising multiple dies each comprising a programmable feature, wherein the multiple dies were formed on a same wafer and are interconnected by cross reticle wires formed in uppermost layers of the same wafer;

receiving defect constraints identifying defective resources in one or more of the programmable features of the multiple dies;

generating a design for the multi-die device that avoids the defective resources using the netlist and the defect constraints; and generating, based on the design, a bitstream for configuring the programmable features in the multiple dies of the multi-die device.

10. The method of claim 9, wherein the cross reticle wires connect a first die in the multi-die device to each of its directly neighboring dies in the same wafer.

11. The method of claim 9, wherein the programmable features are at least one of programmable logic or a programmable network-on-a-chip (NoC).

12. The method of claim 9, wherein generating the design for the multi-die device comprises:

placing cells in the multiple dies based on the netlist and the defect constraints, wherein the defect constraints identify resources in the programmable feature where the cells cannot be placed.

13. The method of claim 12, wherein generating the design for the multi-die device comprises:

routing signals between the cells based on the netlist and the defect constraints, wherein the defect constraints identify routing resources in the programmable feature which cannot be used to route the signals.

14. The method of claim 9, wherein generating the design for the multi-die device comprises:

upon determining the design does not satisfy the defect constraints, generating an engineering change order to re-implement a portion of the design that relies on the defective resources.

15. The method of claim 14, wherein generating the design for the multi-die device comprises:

forming a union of defect constraints for a plurality of multi-die devices, each of the plurality of multi-die devices having different defective resources; and upon determining the design does not satisfy the union of defect constraints, generating an engineering change order to re-implement the portions of the design that rely on the different defective resources, wherein the bitstream is generated after the engineering change order has been resolved, and wherein the bitstream is suitable to separately configure each of the plurality of multi-die devices despite these devices having different defective resources.

16. The method of claim 9, further comprising:

partitioning the netlist into a plurality of sub-netlists each defining schematics for a respective one of the multiple dies in the multi-die device, wherein generating the design for the multi-die device comprises:

generating, in parallel, a respective design for each of the sub-netlists using different computing resources; and merging the respective designs to form the design.

17. A multi-die device, comprising:

multiple programmable dies, wherein the multiple dies are part of a same wafer and comprises a first programmable die and a second programmable die, wherein each of the first and second programmable dies comprises a programmable feature; and cross reticle wires formed in uppermost layers of the same wafer connecting the first programmable die of the multiple dies to the second programmable die of the multiple dies, wherein the first and second programmable dies directly neighbor each other in the multi-die device, wherein a bitstream for configuring the programmable features in the first and second programmable dies is generated based on defective resources identified in one or more of the programmable features of the first and second dies.

18. The multi-die device of claim 17, wherein each programmable die comprises a plurality of FPGA interconnect (INT) tiles disposed at an edge of the respective programmable die, wherein super long lines (SLLs) connect FPGA INT tiles in the first programmable die to FPGA INT tiles in the second programmable die, wherein the SLLs form at least part of the cross reticle wires.

19. The non-transitory computer readable storage medium of claim 1, wherein the defective resources comprises one or more faulty resources in the multiple dies and can be identified by coupling the wafer to a testing apparatus.

20. The method of claim 9, wherein the defective resources comprises one or more faulty resources in the multiple dies and can be identified by coupling the wafer to a testing apparatus.

\* \* \* \* \*